(12) United States Patent
Sinha

(10) Patent No.: US 6,554,560 B2
(45) Date of Patent: Apr. 29, 2003

(54) METHOD FOR ALIGNING WAFERS IN A CASSETTE

(75) Inventor: Vijai Sinha, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/905,070

(22) Filed: Jul. 16, 2001

(65) Prior Publication Data

US 2001/0038791 A1 Nov. 8, 2001

Related U.S. Application Data

(62) Division of application No. 09/236,492, filed on Jan. 25, 1999.

(51) Int. Cl.[7] .............................................. B65G 49/07
(52) U.S. Cl. ..................... 414/757; 414/433; 414/936
(58) Field of Search .................. 198/394; 414/416, 414/417, 741, 754, 757, 433, 816, 936, 938

(56) References Cited

U.S. PATENT DOCUMENTS

| | | | | |
|---|---|---|---|---|
| 3,982,627 A | * | 9/1976 | Isohata | |
| 4,441,853 A | * | 4/1984 | Kosugi | 414/757 |
| 4,655,584 A | * | 4/1987 | Tanaka et al. | 355/53 |
| 4,892,455 A | * | 1/1990 | Hine | 414/433 |
| 4,970,772 A | | 11/1990 | Steere, III | 29/271 |
| 5,028,200 A | * | 7/1991 | Shimane | 414/757 |
| 5,183,378 A | * | 2/1993 | Asano et al. | 414/757 |
| 5,205,028 A | | 4/1993 | Leonard | 29/271 |
| 5,217,341 A | * | 6/1993 | Webber et al. | 414/417 |
| 5,382,806 A | * | 1/1995 | Bacchi et al. | 250/261 |
| 5,516,732 A | | 5/1996 | Flegal | 437/250 |
| 5,533,243 A | | 7/1996 | Asano | 29/25.01 |
| 5,551,829 A | | 9/1996 | Jerolimov et al. | 414/757 |
| 5,662,452 A | | 9/1997 | Allison | 414/757 |
| 5,853,284 A | * | 12/1998 | Ohzeki et al. | 414/757 |
| 5,980,188 A | * | 11/1999 | Ko et al. | 414/417 |

* cited by examiner

Primary Examiner—Janice L. Krizek
(74) Attorney, Agent, or Firm—George O. Saile; Rosemary L. S. Pike

(57) ABSTRACT

A wafer orienting apparatus for aligning a plurality of semiconductor wafers each of which has a v-notch formed on its outer periphery. The apparatus includes a cassette process carrier for supporting the plurality of wafers in parallel wafer supporting slots and wafer supporting means engaging the periphery of each wafer in an individual slot with the central axis of all wafers in coaxial alignment. A supporting platform is placed over the cassette for supporting the wafers in an inverted position in which the wafers are substantially vertical and biased by their own weight against a multiplicity of orienting mechanisms. The orienting mechanisms are arranged to correspond to each wafer position within the cassette. The plurality of orienting mechanisms are integrated with the supporting platform so that all wafers within the cassette can be aligned during this aligning process. Each orienting mechanism includes a v-block that is mounted substantially normal to and in vertical alignment below each wafer axis, and has two degrees of vertical freedom relative to the supporting platform with spring means for biasing the apex of the v-block towards the peripheral edge of the wafer. The v-block is positioned between a pair of supporting friction drive rollers. The rollers are in a first position for engaging the periphery of the wafer and are rotatively driven to impart rotation to the wafer, thereby, with time, aligning the notch to the v-block thus permitting the apex to be urged into the aligned notch. Because the rollers are connected by an assembly to the v-block, they move downwards, away from the wafer, when the v-block moves upwards, and the wafer, now in alignment, ceases to rotate.

18 Claims, 3 Drawing Sheets

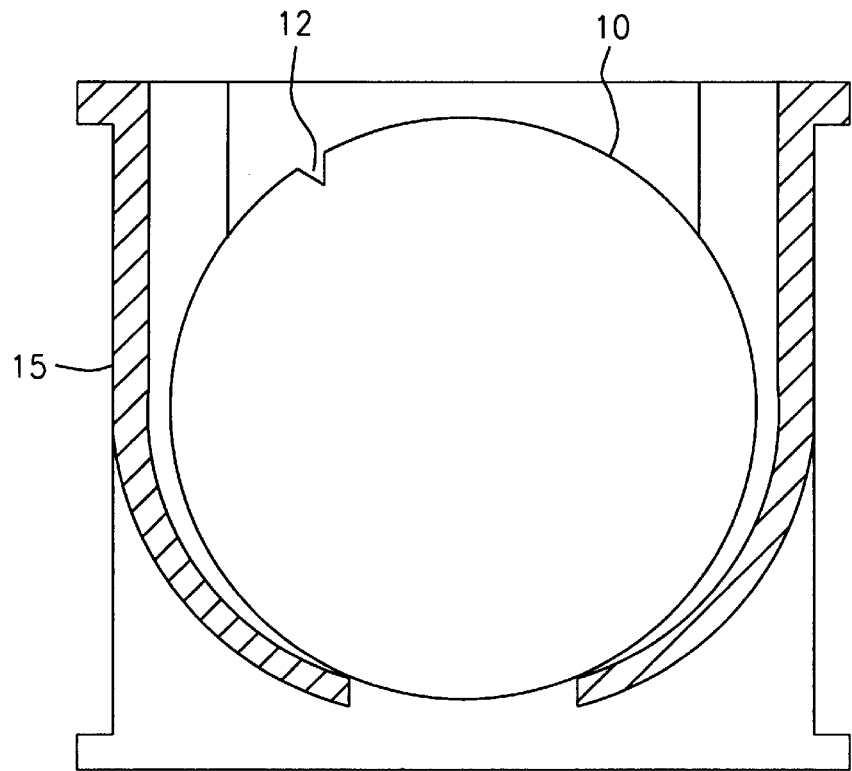
*FIG. 1 - Prior Art*
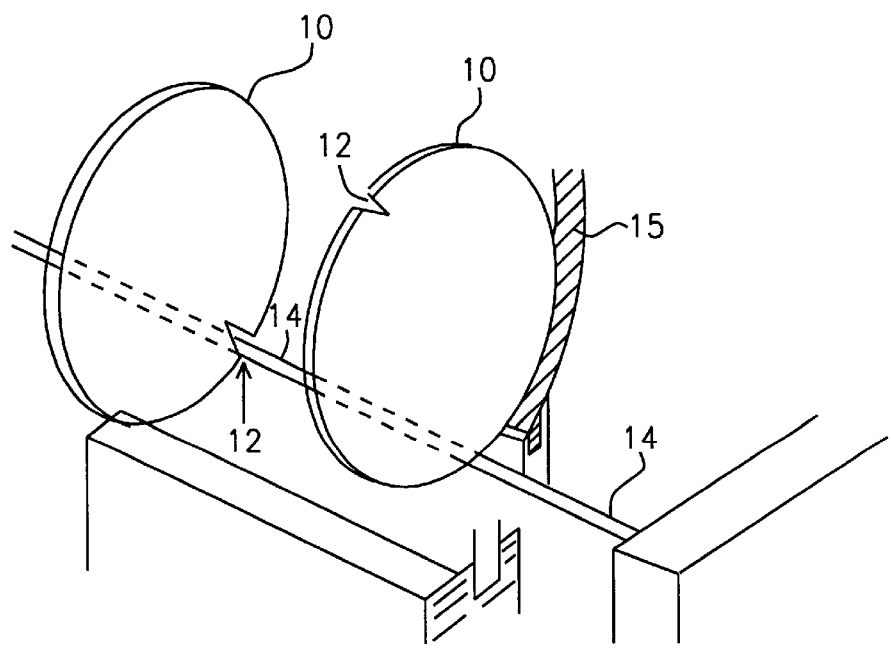
*FIG. 2 - Prior Art*

METHOD FOR ALIGNING WAFERS IN A CASSETTE

This is a division of patent application Ser. No. 09/236,492, filing date Jan. 25, 1999, A Method For Aligning Wafers In A Cassette, assigned to the same assignee as the present invention.

BACKGROUND OF THE INVENTION (1) Technical Field

This invention relates to a wafer orienting apparatus. More particularly, this invention relates to a wafer orienting apparatus for wafers having a notch on a periphery using mechanical motion only.

(2) Description of the Prior Art

The following six documents relate to apparatus dealing with positioning a notch or flat on a periphery of a semiconductor wafer to identify its orientation.

U.S. Pat. No. 4,970,772 issued Nov. 20, 1990 to Robert E. Steere, III shows a method for aligning semiconductor wafers in a wafer cassette by providing an alignment fixture for wafers having a notch in a periphery.

U.S. Pat. No. 5,205,028 issued Apr. 27, 1993 to Thomas E. Leonard describes a method which can align notched wafers and/or align wafers with flats with one another.

U.S. Pat. No. 5,516,732 issued May 14, 1996 to Christopher Fleggal describes a method of pre and post handling and treatment of wafers in a vacuum between wafer cassette modules and a multistation wafer processing machine.

U.S. Pat. No. 5,533,243 issued Jul. 9, 1996 to Takanobu Asano describes a notch position aligning device with a rotating/supporting mechanism to align a plurality of wafers in a predetermined direction and minimize contact between the target and other members.

U.S. Pat. No. 5,551,829 issued Sep. 3, 1996 to Mark J. Jerolimov et describes an orientation apparatus and method for aligning indexing notches of disk-shaped members, such as semiconductor wafers, with a flexible, non-particulating alignment rod which rotates until the indexing notches are registered with the alignment rod.

U.S. Pat. No. 5,662,452 issued Sep. 2, 1997 to Quincy D. Allison describes an apparatus and method for aligning indexing notches of disk-shaped members, such as semiconductor wafers, using friction between the circumferential surfaces of an alignment rod and the drive roller.

During various stages of semiconductor wafer processing, precise positioning of a wafer is critical. For example, a fabrication step that includes ion implantation requires that the orientation of the crystalline lattice of the semiconductor material be known. For another example, there must be a precise alignment of a semiconductor wafer relative to a reticle or photomask, if the reticle or photomask is to be used to pattern a conductive layer for forming signal paths along a previously fabricated circuit structure on the wafer.

Various types of cassettes have been provided for conveying a plurality of wafers, such as semiconductor silicon wafers, from one place to another. Wafers are formed with a notch in the periphery for identification purposes and subsequent alignment and other operations. In order to align such wafers in a cassette, it has been known to use a wafer orienting apparatus. The apparatus usually includes a cassette support means to receive a cassette containing a row of wafers as well as a roller to lift the wafers within the cassette and to rotate the wafers until the notch in each wafer comes into alignment (usually with a steel rod) and drops down.

Referring to FIG. 1, typically, asemiconductor wafer 10 will include both a wafer flat and an indexing notch 12 for positioning. A wafer flat or indexing notch 12 is an edge feature and is used to identify the orientation of the wafer 10. There are devices designed to align the flats of wafers 10, as well as "notch finders," devices which align the notches 12 of a semiconductor wafer 10 contained within a cassette 15.

Referring to FIG. 2, a schematic representation of the prior art showing the semiconductor wafers 10 with notched peripheries 12 in position in the cassette 15 with a pair of curvilinear walls which are sized to seat a wafer in an upstanding manner. FIG. 2 also shows the prior art rotating stainless steel rod 14, which acts as an aligning roller.

Referring now more particularly to FIG. 2 of the prior art, the notch finder may have a small diameter stainless steel rod 14 having a coating of polyvinlydenefloride. When the cassette 15 is positioned on the device, the edges of the wafer in the cassette 15 contact the stainless steel rod 14. Rotation of the stainless steel rod 14 causes the wafers 10 to rotate within the cassette 15. When a notch 12 of a rotating wafer 10 reaches the stainless steel rod 14, the notch 12 allows for the wafer 10 to drop slightly onto the rod 14. The stainless steel rod 14 continues to rotate, but the notch-to-rod registration prevents further rotation of the wafer 10. Within a relatively short time, all of the wafers 10 in the cassette 15 have been aligned.

In the prior art of FIG. 2, once the wafer 10 has been placed in the cassette 15, a minimum of time and effort is required to bring about an alignment of the notches 12 of the respective wafers 10 in the cassette 15. The cassette 15 is of conventional structure. The wafer 10 is rotated by the rotating stainless steel rod 14 until the notched periphery 12 comes in contact with the rod 14, falling down into alignment and ceasing to rotate A notch finder may also include a mechanism for uniformly rotating the wafer notches after an alignment operation. Rollers may be positioned on opposite sides of the stainless steel rod out of contact with the wafers during the notch alignment operation. Then, the rollers may be moved upwardly to contact the wafer edges, lifting the notch away from the stainless steel rod. The rollers can then be rotated to relocate the aligned notches to a desired position.

Conventional notch finders operate well for their intended purpose. However, there are concerns relating to the operation of the conventional notch finders. As previously noted, the stainless steel rod continues to rotate after the first notch is brought into registration with the rod. Rotation of the stainless steel rod against the stationary edges of the notch generates noises that can be disruptive to persons in the vicinity of the notch finder. More importantly, the relative rotation between the stainless steel rod and the semiconductor wafer may generate particles that settle on the surface of one or more of the wafers. Particulate contamination will adversely affect the manufacturing throughput of the semiconductor fabrication process.

SUMMARY OF THE INVENTION

It is the object of the present method to orient semiconductor wafers having a notched periphery using mechanical motion only. Another object of the invention is to provide a method for aligning wafers which is simple, inexpensive and effective and has applications potential for any tool that does not have a built-in wafer orientor. Another object of the invention is to simplify aligning a plurality of wafers by joining together, for example, 25 such assemblies and thus aligning 25 wafers at the same time.

Another object of the invention is to eliminate particulate generation during the alignment procedure which can greatly undermine the efficiency of the semiconductor, and to eliminate damage to the wafers by allowing the aligner to function in a vertical position for loading and then turn down into a horizontal position for processing.

Yet another object of the invention is its easy modification to accommodate wafers of any size, provided they are notched, by simply modifying the length of the elbow arm.

In accordance with the objects of this invention, an apparatus for aligning a plurality of semiconductor wafers, having an orientation notch and contained in a wafer cassette, is achieved.

The plurality of semiconductor wafers are contained in a cassette that is conventionally used in the industry. The wafers are equidistantly spaced within the cassette so that the wafers do not make contact during storage, transportation or handling.

In the preferred embodiment, a plurality of wafer orientation mechanisms coinciding with each wafer position of a cassette, are placed as an assemblage over a cassette containing a plurality of wafers. The wafer orientation assembly is first secured to the cassette and then inverted allowing the weight of each wafer to contact the orientation mechanism.

A wafer orienting apparatus for aligning a plurality of semiconductor wafers each of which has a v-notch formed on its outer periphery. The apparatus includes a cassette process carrier for supporting the plurality of wafers in parallel wafer supporting slots and wafer supporting means engaging the periphery of each wafer in an individual slot with the central axis of all wafers in coaxial alignment. A supporting platform is placed over the cassette for supporting the wafers in an inverted position in which the wafers are substantially vertical and biased by their own weight against a multiplicity of orienting mechanisms. The orienting mechanisms are arranged to correspond to each wafer position within the cassette. The plurality of orienting mechanisms are integrated with the supporting platform so that all wafers within the cassette can be aligned during this aligning process. Each orienting mechanism includes a v-block that is mounted substantially normal to and in vertical alignment below each wafer axis, and has two degrees of vertical freedom relative to the supporting platform with spring means for biasing the apex of the v-block towards the peripheral edge of the wafer. The v-block is positioned between a pair of supporting friction drive rollers. The rollers are in a first position for engaging the periphery of the wafer and with means for rotatively driving each roller to impart rotation to the wafer, thereby, with time, aligning the notch to the v-block thus permitting the apex to be urged into the aligned notch. Because the rollers are connected by an assembly to the v-block, they move downwards, away from the wafer, when the v-block moves upwards, and the wafer, now in alignment, ceases to rotate.

DESCRIPTION OF THE DRAWINGS

FIG. 1 schematically illustrates the 2-dimensional representation of the wafer of the prior art.

FIG. 2 schematically illustrates a 3-dimensional representation of the prior art.

DETAILED DESCRIPTION OF THE PREFERRED EMBODIMENT

Figure 3:
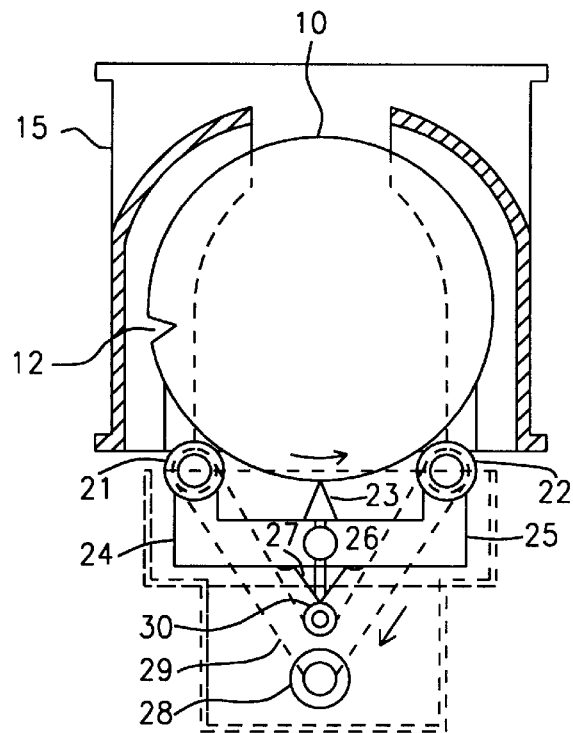
FIG. 3 schematically illustrates the cross-sectional representation of the invention.

This invention relates to a wafer orienting apparatus for aligning semiconductor wafers 10 having a notched periphery 12 using mechanical motion only. FIG. 3 shows the wafer resting on two pinch rollers 21, 22 and a v-block 23 slideably coupled to a fixed axle 26. The two pinch rollers 21, 22 are coupled by a continuous loop drive belt 29 that is routed in a "V" pattern encircling both pinch rollers, a rotatable driver 28 and take-up pulley 30. Both the rollers 21 and 22 and a stretchable leaf spring 27 are connected by an elbow joint assembly 24, 25 so that when the notched periphery 12 of the wafer 10 arrives at the v-block 23, the v-block will be urged upwards by the stored energy in the stretched leaf spring 27, causing the pinch rollers 21, 22 to move downwards and away from the wafers 10. The wafer will than cease to rotate and stay in position and alignment with the v-block 23.

Figure 4:
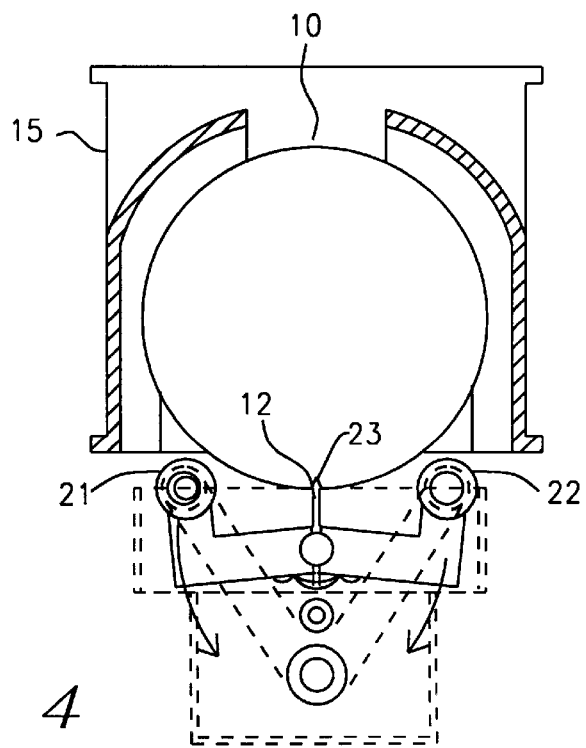
FIG. 4 schematically illustrates a cross sectional representation of the invention showing all the components of the assembly and the direction of movement of the various components.

As FIG. 4 illustrates, in this invention, the wafer 10 comes into alignment when the spring-loaded v-block 23 meets the notch 12 in the rotating wafer. The v-block 23 moves upward positioning itself in the notched periphery of the wafer and simultaneously, the pinch rollers 21 and 22 move downwards and away from the wafer periphery. Not only does the wafer cease to rotate at this time, but the downwards motion of the rollers eliminates any further friction between the wafers and the rollers, eliminating as well any particle generation and potential contamination of the semiconductor surface.

By joining together a plurality of such apparatus as the invention describes, the preferred embodiment can align a plurality of wafers at the same time.

Referring now more particularly to FIG. 3, there is shown an illustration of a cross-sectional view of the invention which uses two rollers 21, 22 and a v-block 23 rather than a stainless steel rod 14 (FIG. 2) in the alignment mechanism. The pinch rollers 21, 22 will rotate in union and the v-block 23 is springloaded. Both the rollers 21, 22 and the v-block 23 are connected by an elbow joint assembly 24, 25 so that when the notched periphery 12 of the wafer 10 arrives at the v-block 23, the v-block 23 will move upwards, causing the pinch rollers 21, 22 to move downwards and away from the wafers 10. The wafers 10 will then cease to rotate and stay in position and alignment with the v-block 23.

Figure 5:
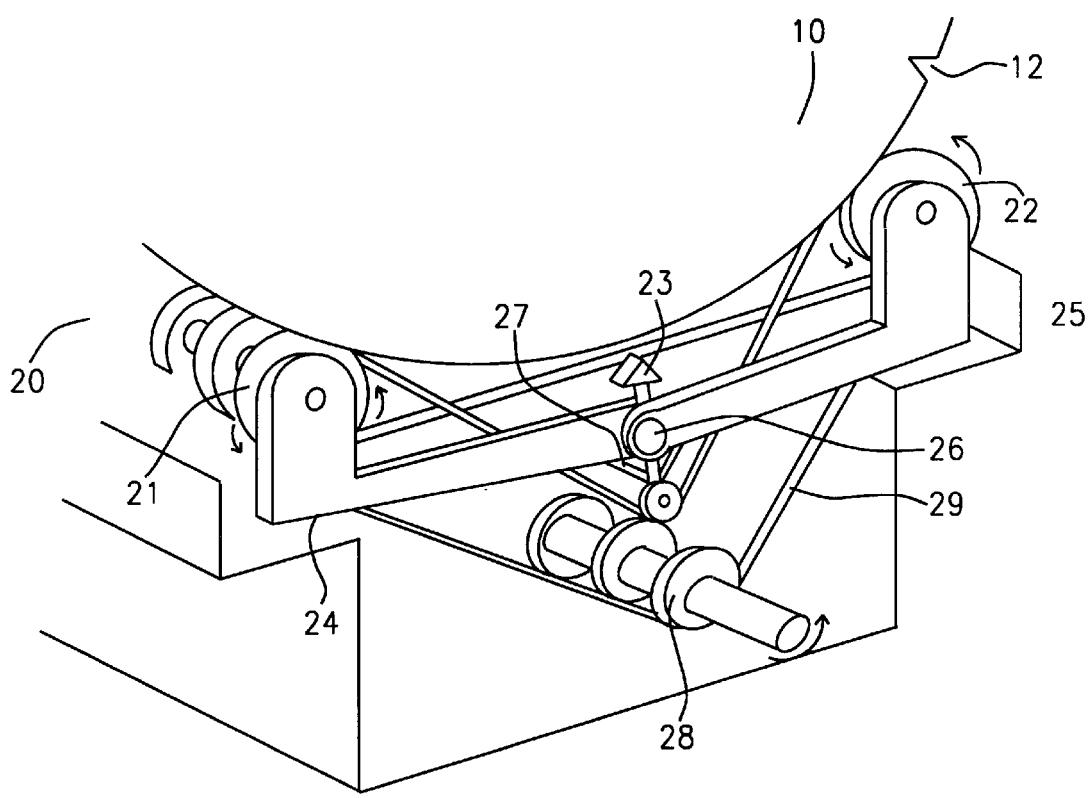
FIG. 5 schematically illustrates a 3-dimensional representation of the invention showing all the components of the apparatus and the direction of movement of the various components as well as how a series can be accommodated to align multiple wafers at the same time.

Referring now to FIG. 5, a 3-dimensional schematic representation of a wafer notch alignment assembly 20 showing a partial number of a series of alignment mechanisms by joining together, for example, twenty-five such mechanisms thereby providing notch alignment for at least 25 wafers contained in a wafer cassette. Each pair of pinch rollers 21 and 22 connected to an elbow joint assembly 24, 25, are driven in a counterclockwise direction while rotating the periphery of wafers 10, in unison, by the drive belt arrangement 29, assembled to each mechanism, and driven by a single driver 28 until a notch 12 of a wafer 10 meets its v-block 23. This is best shown in FIGS. 3 and 4. Each alignment mechanism reacts to each wafer notch separately. That is, when a particular wafer's notch is in position, a stretched band spring 27 urges the slideable v-block upwards and into the notch 12 as the stretched band spring retracts. As the v-block is urged upwards, the pinch rollers 21, 22 move downwards. Once the notched periphery 12 of the wafer 10 is captured by the v-block 23, that particular wafer will cease to rotate and stay in alignment while the others will continue to rotate until its notches are in position.

By simple modification of the length of the elbow arm assemblies 24, 25, virtually any size wafer 10 can be accommodated by the invention.

While the invention has been particularly shown and described with reference to the preferred embodiments thereof, it will be understood by those skilled in the art that various changes in form and details may be made without departing from the spirit and scope of the invention.

What is claimed is:

1. Apparatus for orienting a semiconductor wafer having a v-notch formed on the outer periphery said apparatus comprising:

a supporting means for supporting said wafer in a vertical position, said supporting means engaging the periphery of said wafer, a supporting platform for supporting said wafer in an inverted position in which said wafer is substantially vertical and gravitationally biased against an orienting mechanism, said orienting mechanism is appended to said supporting platform, said orienting mechanism comprising a v-block disposed substantially normal to and in vertical alignment with said wafer's center, said v-block having two degrees of vertical freedom relative to said supporting platform, said v-block having its apex at its upper end and spring means for biasing the apex of said v-block towards said wafer's periphery, said v-block is linked to and disposed between a pair of elbow members each having a friction drive roller in a first position for engaging the periphery of said wafer, means for rotatively driving said drive rollers to impart rotation to said wafer for aligning said notch with said v-block, said apex of said v-block is urged into said notch when said notch is aligned thereby imparting vertical movement of said v-block, thereafter effecting said drive rollers to move to a second position away from the periphery of said wafer.

2. The apparatus of claim 1 wherein said supporting means is a conventional wafer process cassette.

3. The apparatus of claim 1 wherein said supporting platform has a like number of orienting mechanisms as the number of wafer slots in a cassette.

4. The apparatus of claim 1 wherein the v-block and the pair of elbow members are mechanically linked such when the v-block moves upward, the friction drive rollers move downwards to the second position.

5. The apparatus of claim 4 wherein the second position is where the friction drive rollers are not in contact with the wafer.

6. The apparatus of claim 1 wherein the spring biasing means opposes a portion of the weight of the wafer.

7. The apparatus of claim 1 wherein a plurality of orienting mechanisms are joined together to allow all wafers in a cassette to be aligned at the same time.

8. The apparatus of claim 1 wherein a change to the length of the elbow members allows the handling and orienting of differently sized wafers.

9. The apparatus of claim 1 wherein disengaging the friction roller from contacting the wafer after the notch is found prevents particulate contamination.

10. Apparatus for orienting a plurality of semiconductor wafers each of which has a v-notch formed on the outer periphery, said apparatus comprising:

a cassette supporting means for supporting said plurality of wafers in parallel wafer supporting slots and wafer supporting means engaging the periphery of each wafer for supporting each wafer in an individual slot with the central axis of all wafers in coaxial alignment;

a supporting platform for supporting said cassette in an inverted position in which said plurality of semiconductor wafers are substantially vertical and gravitationally biased against a plurality of orienting mechanisms arranged to correspond to each wafer position of said cassette, said plurality of orienting mechanisms are appended to said supporting platform, each orienting mechanism comprising a v-block disposed substantially normal to and in vertical alignment below said wafer axis, said v-block having two degrees of vertical freedom relative to said supporting platform, said v-block having its apex at its upper end and spring means for biasing the apex of said v-block towards the outer periphery of said wafer, said v-block is linked to and disposed between a pair of elbow members each having a friction drive roller in a first position for engaging the periphery of said wafer, means for rotatively driving said drive rollers to impart rotation to said wafer for aligning said notch with said v-block, said apex of said v-block is urged into said notch when said notch is aligned, thereby imparting vertical movement of said v-block, hereafter effecting said drive rollers to move to a second position away from the outer periphery of said wafer.

11. The apparatus of claim 10 wherein a cassette supporting means is a conventional wafer process carrier.

12. The apparatus of claim 10 wherein a supporting platform having a like number of orienting mechanisms to the number of wafer slots in a cassette.

13. The apparatus of claim 10 wherein the v-block and the pair of elbow members are mechanically linked such when the v-block moves upward, the friction drive rollers move downwards to the second position.

14. The apparatus of claim 13 wherein the second position is where the friction drive rollers are not in contact with the wafer.

15. The apparatus of claim 10 wherein the spring biasing means opposes a portion of the weight of the wafer.

16. The apparatus of claim 10 wherein the plurality of orienting mechanisms arc joined together to allow all wafers in a cassette to be aligned at the same time.

17. The apparatus of claim 10 wherein a change to the length of the elbow arms will allow orienting different size wafers.

18. The apparatus of claim 10 wherein disengaging the friction roller from contacting the wafer after the notch is found prevents particulate contamination.

* * * * *